(12) United States Patent
Kleijnen et al.

(10) Patent No.: US 11,255,509 B2
(45) Date of Patent: Feb. 22, 2022

(54) LIGHTING DEVICE WITH NARROW LIGHT EMITTING AREA

(71) Applicant: Lumileds LLC, San Jose, CA (US)

(72) Inventors: Christian Kleijnen, Ell (NL); Floris Maria Hermansz Crompvoets, Bunde (NL); Benno Spinger, Aachen (DE); Thorsten Anger, Aachen (DE)

(73) Assignee: Lumileds LLC, San Jose, CA (US)

( * ) Notice: Subject to any disclaimer, the term of this patent is extended or adjusted under 35 U.S.C. 154(b) by 0 days.

(21) Appl. No.: 16/913,055

(22) Filed: Jun. 26, 2020

(65) Prior Publication Data

US 2020/0408382 A1  Dec. 31, 2020

(30) Foreign Application Priority Data

Jun. 27, 2019  (EP) .................................... 19182805

(51) Int. Cl.
| | |
|---|---|
| *F21V 3/04* | (2018.01) |
| *F21S 4/26* | (2016.01) |
| *F21V 7/00* | (2006.01) |
| *F21V 31/04* | (2006.01) |
| *F21S 4/22* | (2016.01) |

(Continued)

(52) U.S. Cl.
CPC ................. *F21V 3/04* (2013.01); *F21S 4/20* (2016.01); *F21S 4/22* (2016.01); *F21S 4/26* (2016.01);

(Continued)

(58) Field of Classification Search
CPC .......... F21V 3/04; F21V 31/04; F21V 7/0033; F21V 7/0025; F21S 4/26; F21S 4/20; F21S 4/22; F21Y 2103/10

(Continued)

(56) References Cited

U.S. PATENT DOCUMENTS 9,512,984 B2 * 12/2016 Tessnow ............... F21V 29/763
9,752,735 B2 *  9/2017 Chamberlain ........... F21V 3/02
(Continued)

FOREIGN PATENT DOCUMENTS

CN   109585487 A     4/2019
JP     5982443 B2 *  8/2016
(Continued)

OTHER PUBLICATIONS

"International Application Serial No. PCT/EP2020/065266, International Search Report dated Dec. 16, 2020", 6 pgs.

(Continued)

*Primary Examiner* — Laura K Tso
(74) *Attorney, Agent, or Firm* — Schwegman Lundberg & Woessner, P.A.

(57) ABSTRACT

A lighting device contains light-emitting elements and has an elongated shape. The lighting device has a housing that has reflective side walls extending in a longitudinal direction of the housing; a cavity formed between the reflective side walls; and light-emitting elements arranged at least partially along the longitudinal direction relative to each other in the cavity. An opening of the cavity forms a light-emitting area, A width of the cavity expands from the light-emitting elements towards the opening at least in sections. A reflective element covers at least a section of the opening and reflects a part of light emitted from the light-emitting elements towards the cavity and reduces a width of the light-emitting area compared to a width of the opening.

19 Claims, 5 Drawing Sheets

(51) Int. Cl.
  *F21S 4/20* (2016.01)
  *F21Y 103/10* (2016.01)
  *F21Y 115/10* (2016.01)

(52) U.S. Cl.
  CPC .......... *F21V 7/0025* (2013.01); *F21V 7/0033* (2013.01); *F21V 31/04* (2013.01); *F21Y 2103/10* (2016.08); *F21Y 2115/10* (2016.08)

(58) Field of Classification Search
  USPC ................................ 362/223, 217.05, 217.1
  See application file for complete search history.

(56) References Cited

U.S. PATENT DOCUMENTS

| | | |
|---|---|---|
| 2017/0108193 A1 | 4/2017 | Faerber et al. |
| 2018/0323352 A1 | 11/2018 | Takano et al. |
| 2020/0144229 A1 | 5/2020 | Liu et al. |

FOREIGN PATENT DOCUMENTS

| | | |
|---|---|---|
| WO | WO-2013046081 A1 | 4/2013 |
| WO | WO-2017062817 A1 | 4/2017 |

OTHER PUBLICATIONS

"International Application Serial No. PCT/EP2020/065266, Written Opinion dated Dec. 16, 2020", 10 pgs.
"European Application Serial No. 19182805.2, European Search Report dated Dec. 16, 2019", 8 pgs.

* cited by examiner

LIGHTING DEVICE WITH NARROW LIGHT EMITTING AREA

PRIORITY APPLICATION

This application claims the benefit of priority to European Patent Application Serial Number 19182805.2, filed Jun. 27, 2019, which is incorporated herein by reference in its entirety.

TECHNICAL FIELD

The present disclosure relates to lighting devices comprising multiple light-emitting elements such as light-emitting diodes (LEDs) arranged along a longitudinal direction of a housing.

BACKGROUND

Light-emitting elements are typically provided with housings for protection and for controlling the shape of light emitted by the light-emitting elements, in particular radiation profile and/or radiation characteristics of the light-emitting elements. Multiple elements may be arranged together in a single housing. The housing may for example have an elongated shape and may be similar in shape to a strip, with the light-emitting elements being arranged along the length of the strip. The light-emitting elements are assembled together with the housing basically as a semi-finished product, significantly reducing production costs. The housing may be based on flexible materials such as silicone that allow a flexing or bending of the lighting device. The lighting device may therefore be brought into a variety of shapes and may in particular be used to form line-shaped emitters that are curved along two axes.

The housing may be configured to increase the efficiency of the lighting device. For instance, significant parts of the housing may be based on highly reflective material and/or may contain optical elements to allow for a reduction of light loss in the lighting device. Further, as light-emitting elements such as LEDs provide high luminance, an arrangement of light-emitting elements without further optical elements is typically perceived as an inhomogeneous, spot-like light source. Consequently, light-emitting elements are typically encased in a housing having a cavity that serves as a "mix box". In the cavity, the emitted light may be reflected one or more times between the reflective side walls of the cavity, which leads to a more homogeneous emission of light the light-emitting area of the lighting device.

With the cavity serving as a mix box, typically, the cavity has a shape that expands from the light-emitting elements towards the light-emitting area. The light is then reflected towards the light-emitting area in a more directed manner leading to a reduced light loss from internal absorption and improved homogeneity of illumination. However, this also means that the minimum width of the light-emitting area is effectively limited by the width of the light-emitting elements, which may be in the range of a few millimeters. For some applications, it is desirable to reduce the width of the light-emitting area further while avoiding additional light loss.

BRIEF DESCRIPTION OF THE DRAWINGS

Examples will now be described in detail with reference to the accompanying drawings, in which.

DETAILED DESCRIPTION OF THE EMBODIMENTS

A lighting device in particular having an elongated shape is disclosed in which the width of the light-emitting area can be controlled while enhancing the effectivity of the lighting device. A method for producing such a lighting device and a use of such a lighting device is also disclosed.

Figure 1:
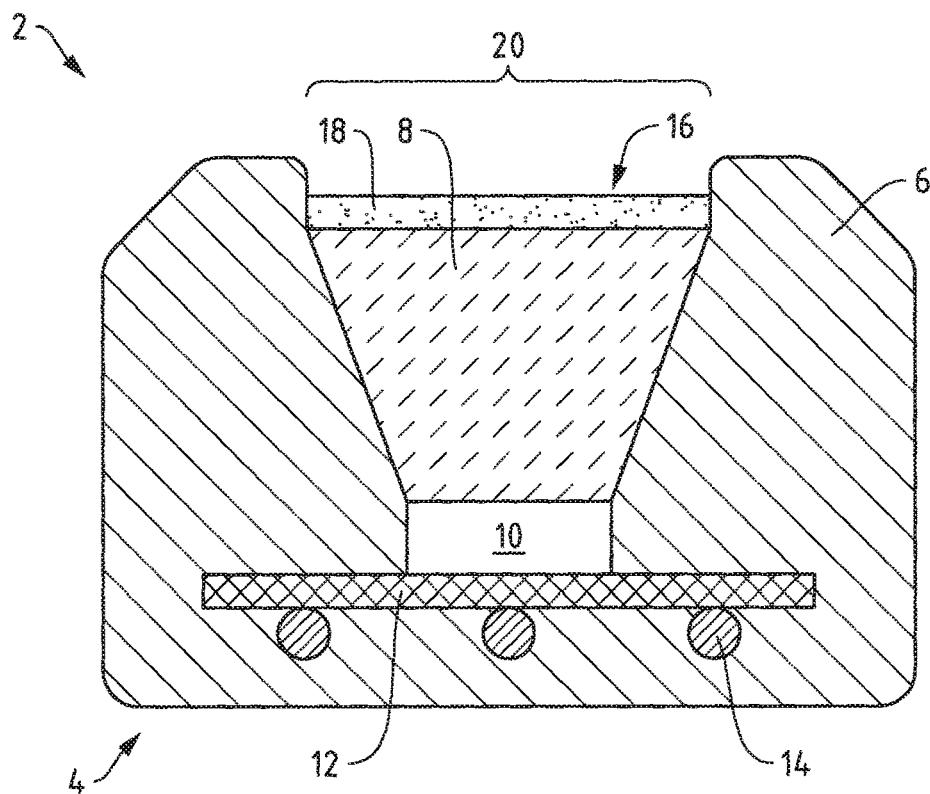
FIG. 1 shows a lighting device without a reflective element in a cross-sectional view.

FIG. 1 shows a lighting device 2 without a reflective element in a cross-sectional view. The lighting device 2 comprises a housing 4, which has a strip-like shape with a longitudinal direction. The view in FIG. 1 corresponds to a cross section perpendicular to the longitudinal direction. The housing 4 comprises reflective side walls 6 extending in the longitudinal direction of the housing 4. A cavity 8 is formed between the reflective side walls 6. Light-emitting elements 10 are arranged at least partially along the longitudinal direction relative to each other in the cavity 8, with one light-emitting element 10 being visible in the sectional view of FIG. 1. The light-emitting elements 10 are configured as LEDs arranged on a substrate 12 such as a printed circuit board (PCB). Connection elements 14 formed by wires connect subsequent light-emitting elements 10 in the longitudinal direction. Providing connection elements in form of wires allows for bendability.

An opening 16 of the cavity 8 is formed at a side of the housing 4 remote from the light-emitting elements 10 between the reflective side walls 6. A diffusor layer 18 is disposed at the opening 16. The opening 16 forms a light-emitting area 20 of the lighting device 2. In the lighting device 2 of FIG. 1, the width of the light-emitting area 20 is identical to the width of the opening 16. The width of the cavity 8 is expanding from the light-emitting elements 10 towards the opening 16, with the cavity 8 being configured as a mix box for the light-emitting elements 10 to improve homogeneity of illumination. In this configuration, the minimum width of the light-emitting area 20 is effectively limited to the width of the light-emitting elements 10 in the lighting device of FIG. 1.

Figure 2:
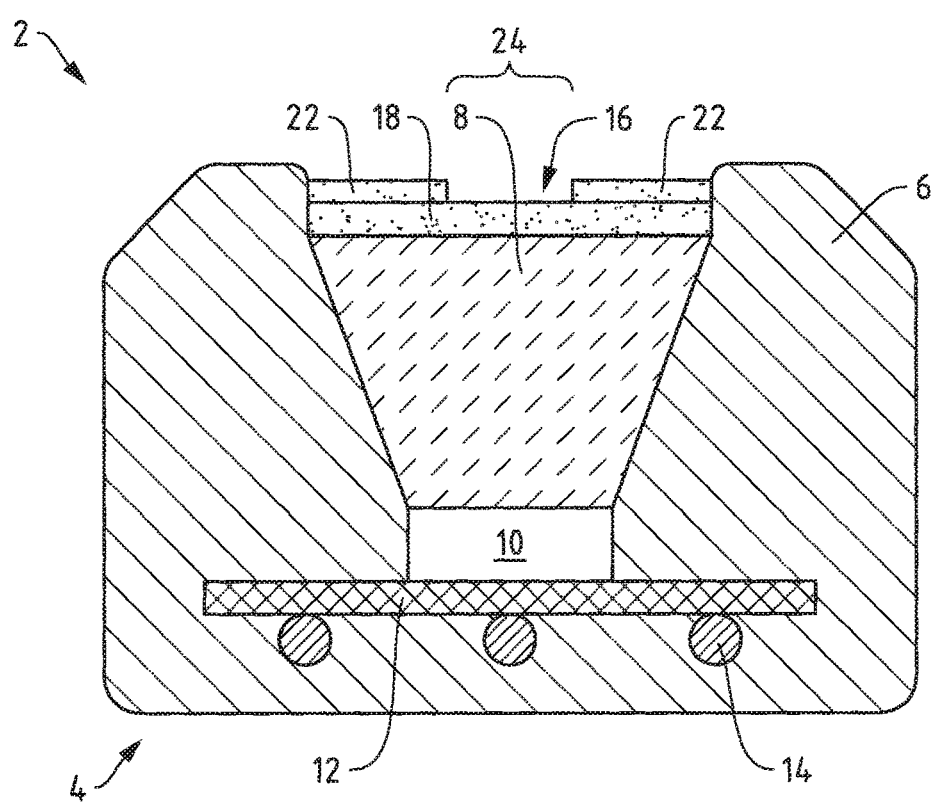
FIG. 2 shows an embodiment of a lighting device in a cross-sectional view.

FIG. 2 shows an embodiment of a lighting device 2 in a cross-sectional view corresponding to the view of FIG. 1. In addition to the elements described with reference to FIG. 1, the lighting device 2 further comprises a reflective element 22 covering sections of the opening 16. The reflective element 22 is configured to reflect a part of light emitted from the light-emitting elements 10 towards the cavity 8 in that at least the side of the reflective element 22 facing the light-emitting elements 10 has reflective properties. The reflective element 22 forms a slit-shaped light-emitting area 24 on the opening 16.

The reflective element 22 covers sections of the opening 16. The reflective element 22 therefore reduces the width of the light-emitting area 24 compared to the width of the opening 16. With the reflective element 22, the width of the light-emitting area 24 is reduced while an undesired loss in intensity is avoided due to the reflective properties. For instance, light reflected by the reflective element 22 may be redirected again by the reflective side walls 6 and may exit the cavity 8 at the light-emitting area 24. Hence, the width of the light-emitting area 24 may be reduced while avoiding light loss. At the same time, the reflection of light by the reflective element 22 improves the efficiency of the cavity 8 as a mix box and improves the homogeneity of illumination.

Figure 3:
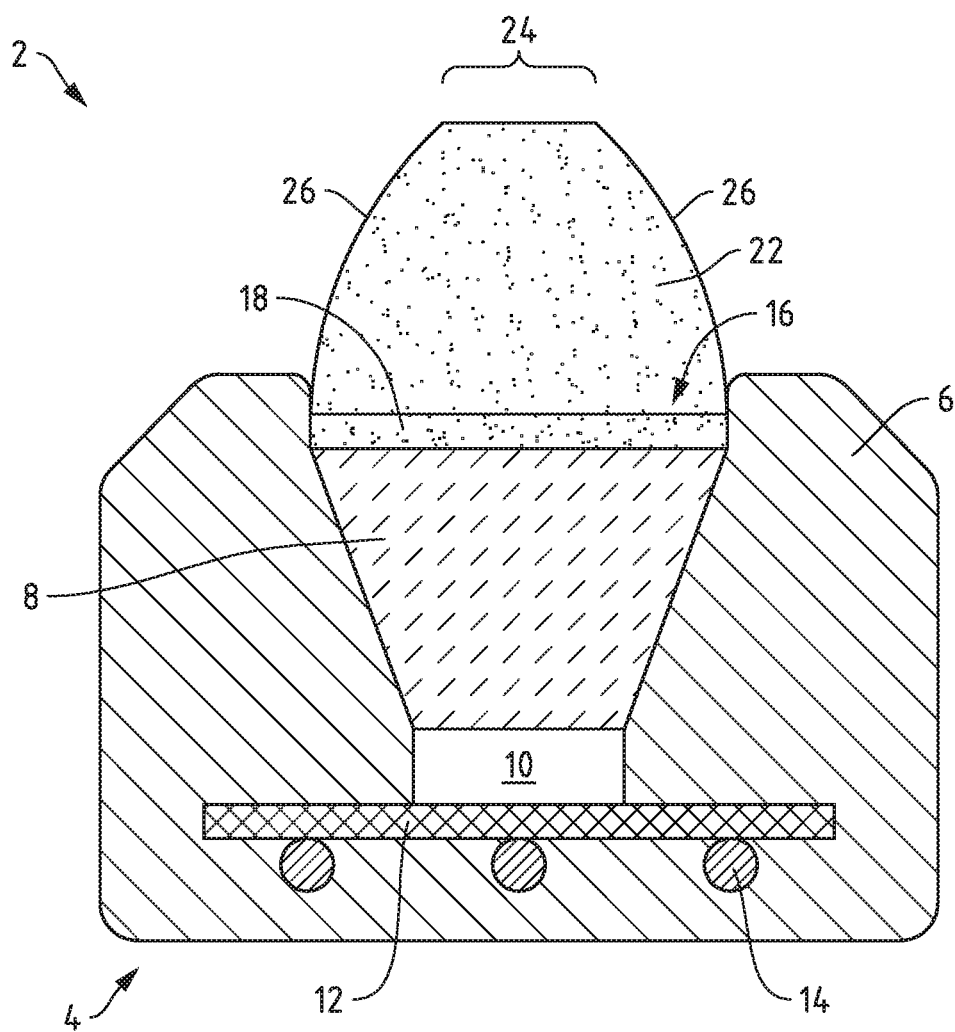
FIG. 3 shows another embodiment of a lighting device in a cross-sectional view.

FIG. 3 shows another embodiment of a lighting device 2 in a cross-sectional view. Here, the reflective element 22 is configured to reflect the part of light emitted from the light-emitting elements 10 towards the cavity 8 by means of total internal reflection on side surfaces 26 of the reflective element 22. The side surfaces 26 for total internal reflection are tapering from the opening 16 towards the light-emitting area 24. The reflective element 22 has a shape of a total internal reflection (TIR) collimator, in which a large collimator surface is directed towards the light-emitting elements 10 while a small collimator surface forms the light-emitting area 24 with a reduced width as compared to the width of the opening 16.

Figure 4:
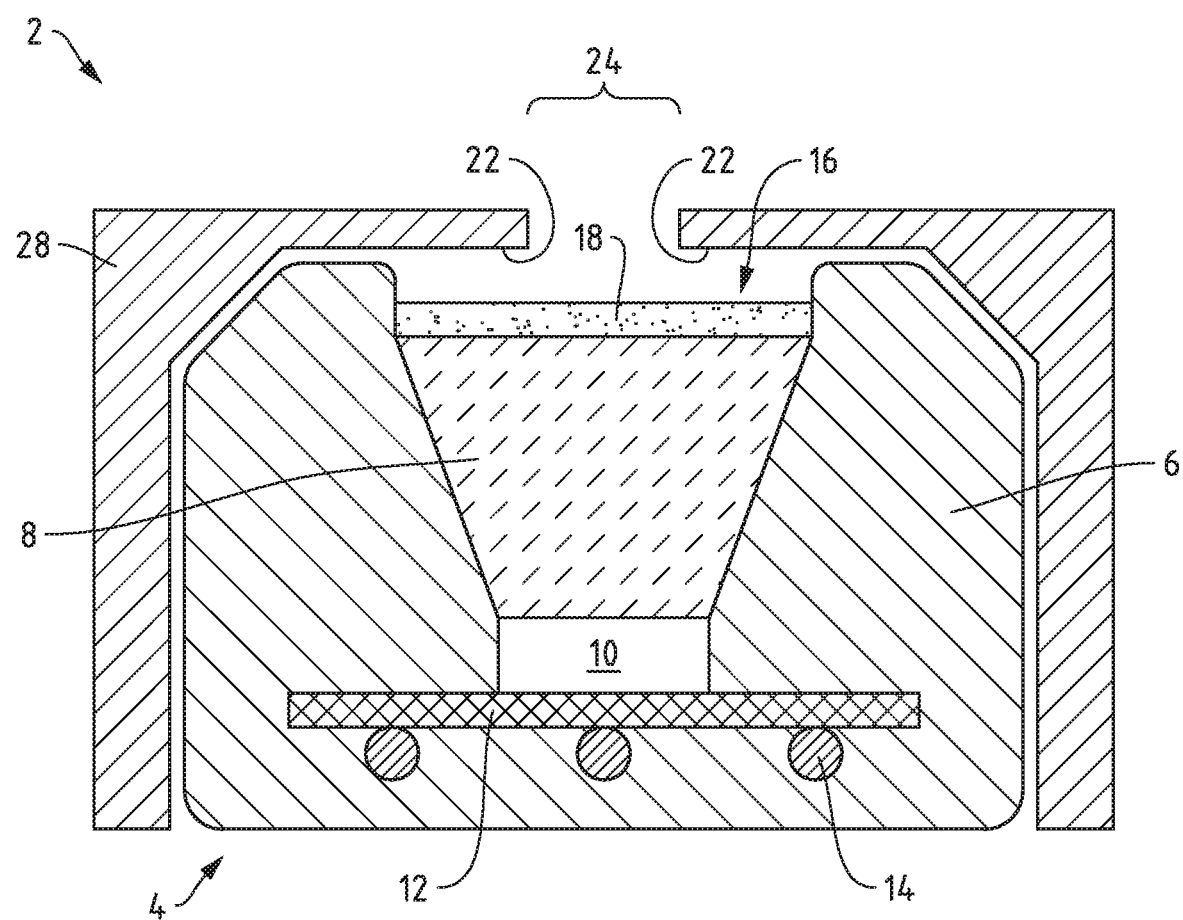
FIG. 4 shows another embodiment of a lighting device in a cross-sectional view.

FIG. 4 shows another embodiment of a lighting device 2 in a cross-sectional view. The lighting device 2 comprises a mechanical fixture 28 for the housing 4. The housing 4 may be subjected to bending and inserted into the mechanical fixture 28, such that the lighting device 2 assumes a predetermined shape given by the mechanical fixture 28. The reflective element 22 is formed on the mechanical fixture 28 and is separate from the housing 4.

Figure 5:
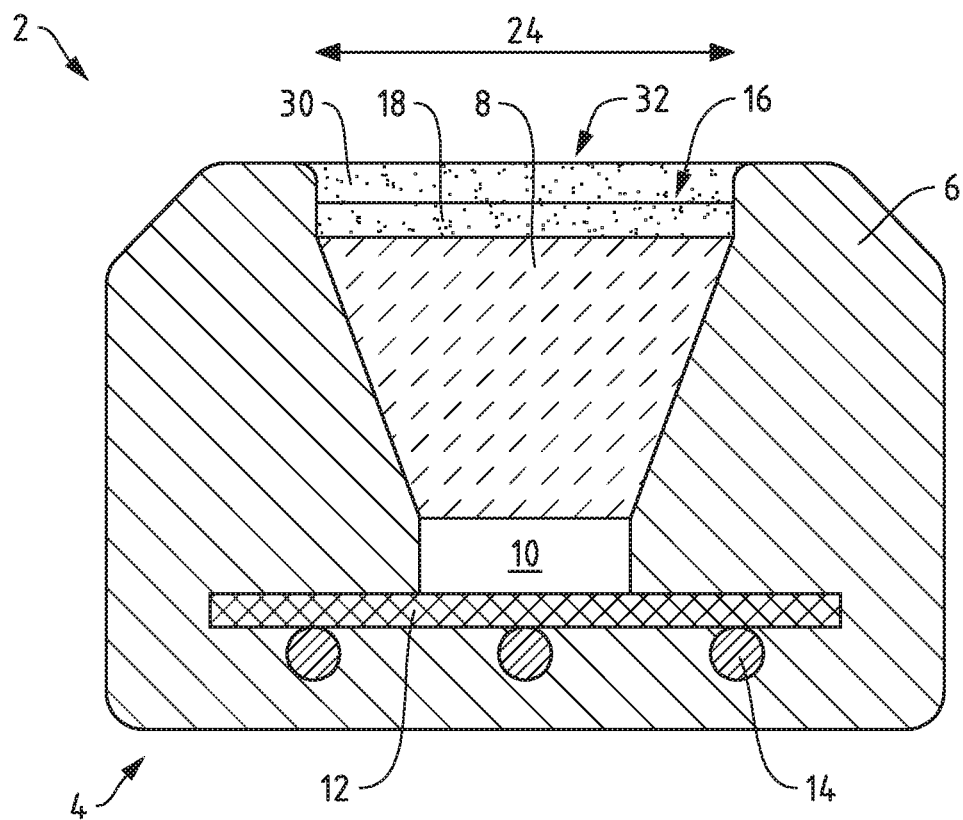
FIG. 5 shows another embodiment of a lighting device in a cross-sectional view.

FIG. 5 shows another embodiment of a lighting device 2 in a cross-sectional view. The reflective element 22 is formed as an integral element of the housing 4 on the opening similar to the embodiment shown in FIG. 2, but the reflective element 22 has in addition a reflectivity that decreases from edge regions 30 to a central region 32 of the opening 16. Therefore, an undesired sharp contrast or cut-off between lit and unlit areas of the lighting device 2 may be avoided.

Figure 6:
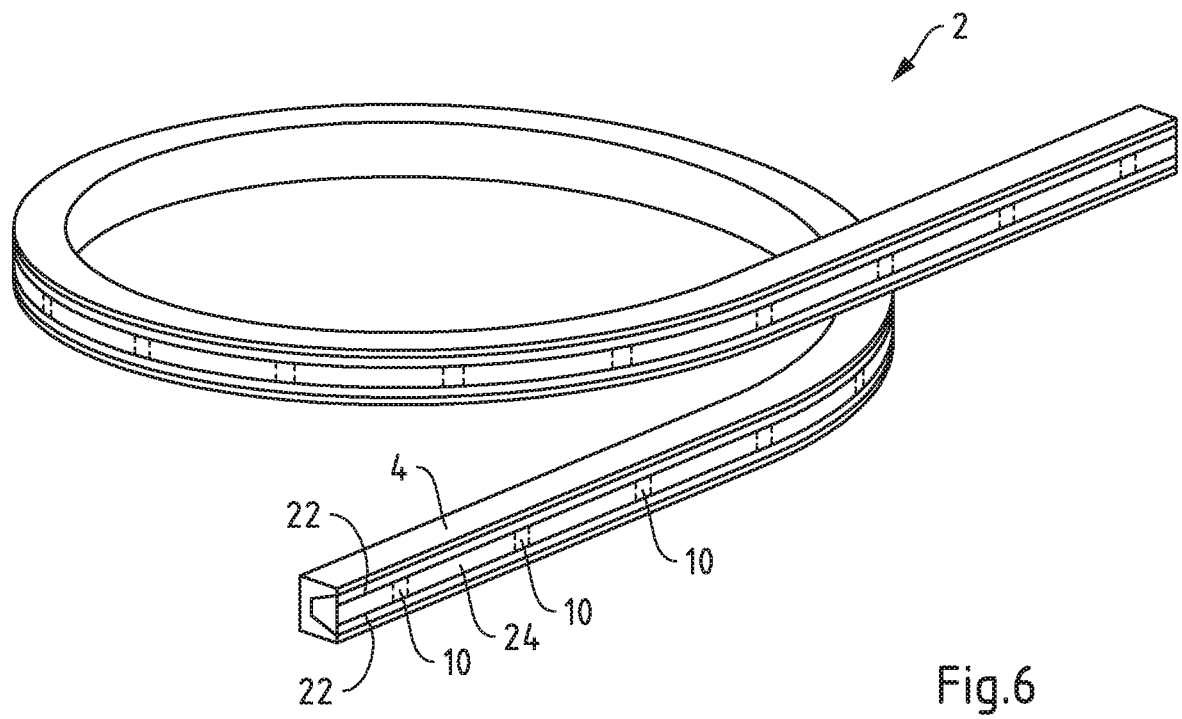
FIG. 6 shows the embodiment of a lighting device of FIG. 2 in a schematic perspective view.

FIG. 6 shows the embodiment of a lighting device 2 of FIG. 2 in a schematic perspective view. It can be seen that the light-emitting elements 10 are arranged along the longitudinal direction of the housing 4. The lighting device 2 is configured as a flexible strip. In particular, the lighting device 2 may be used in automotive lighting, wherein the lighting device 2 can conform to various shapes due to its flexible properties.

Figure 7:
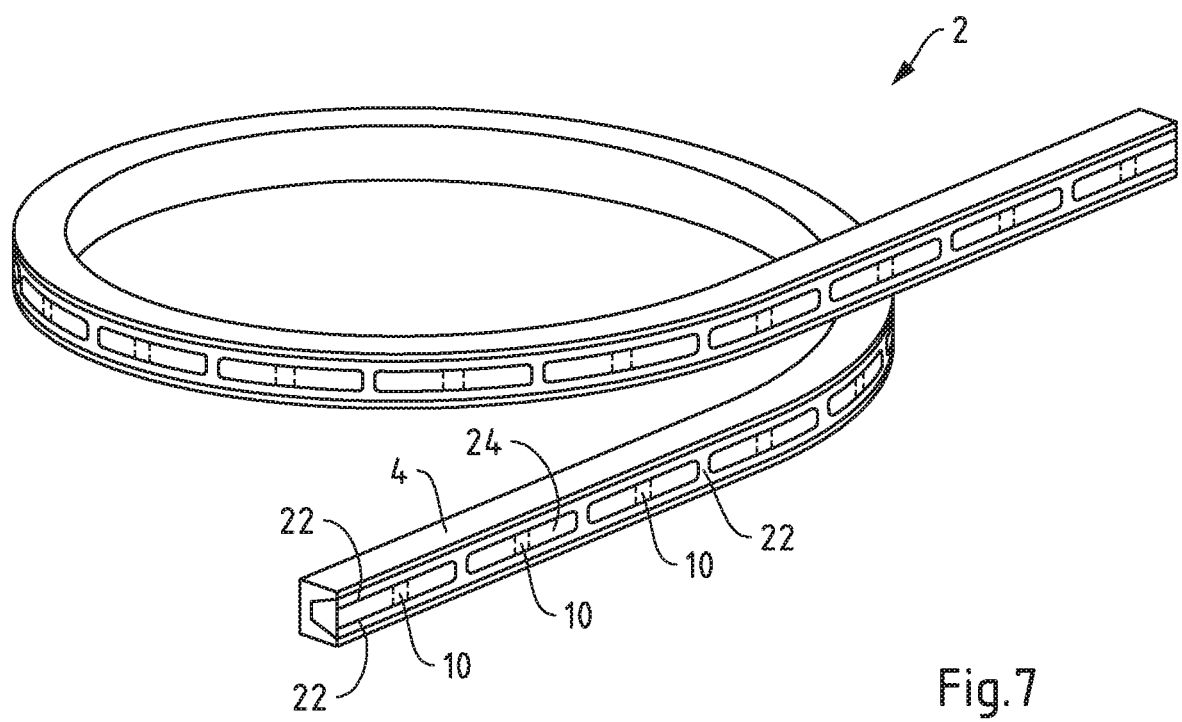
FIG. 7 shows a further embodiment of a lighting device of FIG. 2 in a schematic perspective view.

FIG. 7 shows the embodiment of a lighting device 2 of FIG. 2 where the reflective element 22 is formed in form of a mask, where the light-emitting area 24 is not continuous— is instead "digitized", i.e. split into parts. As shown, to this end, the reflective element 22 is formed to have bridges. In this way, the light-emitting area 24 is limited longitudinal direction, with the bridges forming spacers in the longitudinal direction. As can be taken from the figure, in this way, a mask with holes is formed that may enable shaping the light emission of the lighting device 2 in a desired way. Thus, in an exemplary embodiment, the reflective element 22 comprises a mask shape with a plurality of restrictions and/or holes arranged along the longitudinal direction. It is noted that further elements may be added to shape the light emission, e.g. lens elements corresponding to the light-emitting elements 10 along the longitudinal direction.

According to a first aspect, a lighting device with a housing is provided, in which the housing includes: reflective side walls extending in a longitudinal direction of the housing; a cavity formed between the reflective side walls; light-emitting elements arranged at least partially along the longitudinal direction relative to each other in the cavity, and an opening of the cavity forming a light-emitting area of the lighting device. A width of the cavity expands from the light-emitting elements towards the opening at least in sections. The lighting device also contains a reflective element covering at least a section of the opening. The reflective element is configured to reflect a part of light emitted from the light-emitting elements towards the cavity and to reduce a width of the light-emitting area compared to a width of the opening.

According to a second aspect, a method for producing a lighting device is provided, in particular the lighting device according to the first aspect, the method includes: providing a housing, comprising: reflective side walls extending in a longitudinal direction of the housing; a cavity formed between the reflective side walls; light-emitting elements arranged at least partially along the longitudinal direction relative to each other in the cavity; an opening of the cavity forming a light-emitting area of the lighting device; and covering at least a section of the opening with a reflective element. A width of the cavity expands from the light-emitting elements towards the opening at least in sections. The reflective element is configured to reflect a part of light emitted from the light-emitting elements towards the cavity and to reduce a width of the light-emitting area compared to a width of the opening.

According to a third aspect, a use of a lighting device according to the first aspect is provided in automotive lighting, in particular as automotive interior light.

Exemplary embodiments of the first, second and third aspect of the invention may have one or more of the properties described herein.

As described, the housing has a longitudinal direction, which in particular corresponds to the longest dimension (the length) of the housing. For instance, the housing may substantially be formed in the shape of a strip. The housing may, for example, have a given cross section, in which the cross section is substantially the same along the length of the housing. The housing may, for example, have a substantially trapezoidal or rectangular cross section.

The housing comprises reflective side walls extending in the longitudinal direction with a cavity formed between the reflective side walls. The reflective side walls may each comprise a wall plane. The longitudinal direction is substantially parallel to the wall plane. The reflective side walls may, in particular, be substantially parallel to each other. The cavity is configured to accommodate the light-emitting elements. In an exemplary embodiment, the light-emitting elements are arranged along the longitudinal direction, in particular all light-emitting elements being oriented in parallel on a same side of the housing. The light-emitting elements may be arranged to emit light in a same direction. An opening of the cavity is provided, which may for instance be an opening between the reflective walls, i.e. the reflective walls for example do not enclose the cavity from all sides. The opening enables light emitted by the light-emitting elements to exit the cavity at a light-emitting area of the lighting device. The opening may be configured for a certain desired illumination pattern of the lighting device. The opening may, for instance, resemble a slit that is directed substantially parallel to the longitudinal direction of the housing. In an exemplary embodiment, the cavity comprises a translucent layer (a diffusor layer), in particular formed on or within the opening, the translucent layer being configured to allow at least for a partial transmission of light from the cavity. Such translucent layer may help to further improve homogeneity of light emitted from the opening, i.e. from the light-emitting area of the lighting device. For example, the translucent layer may be diffusive, which may help to improve homogeneity of the light emission. Further, the diffusive layer may form part of the above described mix box formed by the cavity in that the mix box reflects the non-transmitted part of light from the cavity back into the cavity to be again reflected before finally leaving the cavity via the translucent layer.

The light-emitting elements may comprise at least one semiconductor element such as a p-n-junction, a diode, and/or a transistor. The light-emitting elements may be provided as LEDs or LED packages, for example having a substrate, lead frame, wire bond(s), and/or contact elements. The light-emitting elements may be arranged on interposers for providing electrical connection, e.g. interposers configured as printed circuit boards. The light-emitting elements may be arranged in the cavity such that light-emitting faces of the light-emitting elements face the opening of the cavity. The light-emitting elements are at least partially arranged along the longitudinal direction of the housing relative to each other. For example, the light-emitting elements are arranged in intervals along the longitudinal direction of the housing, e.g. in regular or irregular intervals.

The width of the cavity expands from the light-emitting elements towards the opening at least in sections and in particular over the entire length of the cavity from the light-emitting elements towards the opening. The cavity with the reflective side walls is therefore suitable as a mix box for the light emitted by the light-emitting elements, improving the homogeneity of the illumination of the lighting device. Due to the expanding width, absorption losses in the lighting device may be reduced. The light-emitting elements may be arranged completely inside the housing to ensure mechanical protection and to enhance the effectivity of the lighting device. The shape of the reflective side walls may be configured to provide a certain illumination pattern. In particular, the reflective side walls form a cavity with a substantially v-shaped cross section in a direction perpendicular to the longitudinal direction of the housing. As mentioned above, in an exemplary embodiment, a translucent layer (diffusor layer) is formed on or within the opening. In a further exemplary embodiment, the translucent layer comprises a silicone matrix with (e.g. white) scattering particles embedded therein. The translucent layer may in this exemplary embodiment further comprise variations in thickness. Such variations in thickness may be configured (e.g. designed) to correct for an inhomogeneous light emission of light-emitting elements if these correspond to spot-like light sources (e.g. in case the light-emitting elements are LEDs). With the mix box in this embodiment comprising the translucent layer, the mix box is very efficient in creating a homogeneous luminance appearance. At the same time, a high efficiency is maintained due to a high reflectivity of mix box walls.

The reflective element covers at least a section of the opening, to reduce the width of the light-emitting area compared to a width of the opening. Hence, the reflective element may be used to decrease the width of the light-emitting area to a width that is even smaller than the width of the light-emitting elements. At the same time, the reflective element is configured to reflect a part of light emitted from the light-emitting elements back towards the cavity. Instead of a reduction of the width of the light-emitting area with a masking that absorbs part of the emitted light, the reflective element may reflect light back towards the cavity so that the light may be redirected towards the light-emitting area. Hence, the width of the light-emitting area is reduced while an undesired loss in intensity is reduced. Moreover, as part of the light directed towards the opening is reflected back into the cavity, the efficiency of the cavity as mix box may be enhanced and the homogeneity of the illumination is improved. This therefore combines the use of a cavity that is configured as mix box with the possibility to obtain a particularly narrow light-emitting area.

In an exemplary embodiment, the reflective element forms a slit-shaped light-emitting area on the opening, providing for a particularly simple configuration of the reflective element. In particular, the opening may be slit shaped, and the reflective element may reduce the width of the light-emitting area by covering the opening from one or two sides from the reflective side wall(s) towards the center of the opening in a cross section perpendicular to the longitudinal direction. In an embodiment, the arrangement of opening and reflective element is symmetrical with respect to a plane that extends through optical axes of the light-emitting elements.

The reflective element may be reflective in the sense that the reflective element has a total integrated reflectivity at least 90%, in particular at least 95% in the wavelength range that is emitted by the light-emitting elements. In an exemplary embodiment, the reflective element comprises or is made of a reflective material. For example, the reflective element may be formed of a polymer material with embedded reflective particles such as silicone with $TiO_x$ ("white silicone"). Such polymer material may offer flexibility and/or stretchability. Such polymer material may enable bendability along all three axes. In an alternative or additional exemplary embodiment, the reflective element may comprise a reflective film, e.g. an Alanod film.

In an exemplary embodiment, the reflective element has a reflectivity that decreases from an edge region to a central region of the opening. The reflective element may therefore provide a soft transition from the illuminated light-emitting area to the part of the opening that is blocked by the reflective element. Hence, a hard contrast or cut-off between lit and unlit regions of the lighting device may be avoided. The reflective element may, in an exemplary embodiment, have regions of varying thickness such as a decreasing thickness from an edge region to a central region of the opening. Alternatively or in addition, in an exemplary embodiment the reflective element may comprise regions with varying concentrations of reflective particles, e.g. the concentration of reflective particles in white silicone decreases from an edge region to a central region of the opening.

In another exemplary embodiment, the reflective element is configured to reflect the part of light emitted from the light-emitting elements towards the cavity by means of TIR on side surfaces of the reflective element. The reflective element may therefore also comprise or be made of a transparent material. The shape of the reflective element is configured to reduce the width of the light-emitting area by means of TIR. In this sense, TIR elements may be used as reflective elements in the lighting device providing for a very high reflectivity.

In an exemplary embodiment, the side surfaces for total internal reflection are tapering from the opening towards the light-emitting area at least in sections. An example for such a configuration is a TIR collimator as a reflective element. A larger collimator face is directed towards the opening and the light-emitting elements. Collimators are typically used with a small collimator face being directed towards a light source, such that light is collimated and exits the collimator at a large collimator face. By reversing this arrangement of the collimator and directing the small collimator face towards the light-emitting elements, the collimator may be used to reduce the width of the light-emitting area by TIR.

In another exemplary embodiment, at least part of the housing is flexible and is in particular based on silicone. With flexible properties of the housing, at least part of the lighting device may be brought into a variety of shapes. For instance, the housing may be bent to conform a surface of an object or a substrate.

In another exemplary embodiment, the reflective element is formed integrally with the housing. Under "formed integrally", it may be understood that the reflective element forms a single component with at least part of the housing, in particular by material bonding. For instance, the reflective element is formed integrally with the reflective side walls and/or a surface of a transparent filler material that is disposed in the cavity. As mentioned above, in an exemplary embodiment, the cavity comprises a translucent layer, in particular formed at the opening, e.g. on or within the opening. In other words, the cavity may comprise a top layer at the opening and the reflective element may be formed integrally on the top layer. The translucent layer (diffusor layer) or top layer may for instance be configured as diffusor layer. The reflective element may be produced by moulding and/or filling of reflective material on sections of the opening. Integrating the reflective element with the housing may simplify the production process, as the reflective element and at least part of the housing may be manufactured simultaneously in a single production step.

In embodiments comprising a flexible housing, the reflective element may also have flexible properties. Hence, the housing may be formed together with the reflective element as a flexible lighting device. For instance, the reflective element may comprise or consist of a flexible polymer material such as silicone in particular comprising $TiO_2$ particles embedded in the flexible polymer material, e.g. the silicone. Such embedded $TiO_2$ particles may be provided to enable high reflectivity.

In another exemplary embodiment, the reflective element is formed separately from the housing. For example, the reflective element may be part of an enclosure that surrounds the housing at least partially. With the reflective element being formed separately, housings may be fitted with various separate reflective elements which may for instance provide different widths of light-emitting areas. For example, in an exemplary embodiment, the reflective element may be shaped to split the light emitting area, e.g., to "digitize" the light emitting area, e.g., by providing the reflective element comprising bridges covering entire portions of the light emitting area. Such bridges may, e.g., act as spacers in the longitudinal direction, i.e., along the length of the housing (e.g., the strip). Alternatively or in addition, the reflective element may be shaped or comprise lateral restrictions, e.g. forming holes separated by bridge like restrictions. Further alternatively or in addition, lens elements may be added to the reflective element to further tune or adjust the light emission.

In other words, providing a reflective element formed separately from the housing provides an increased freedom such that a single type of housing may be used for a variety of applications requiring different light-emitting areas by choosing the appropriate separate reflective element. Further, a separate configuration allows for instance to use a different type of material for the reflective element. For example, the reflective element may comprise or consist of electromagnetic compatibility (EMC), epoxy, silicone and/or Polytetrafluoroethylene (PTFE).

In an embodiment, a mechanical fixture for the housing is provided. The mechanical fixture may serve to preserve the shape of the housing, for instance in embodiments with a flexible housing that may be bent to obtain curved or "three-dimensional" shapes. The mechanical fixture may also provide a mechanical coupling of the housing to a substrate, e.g., the body of an automobile.

In another embodiment, the reflective element is formed on the mechanical fixture. Hence, the lighting device may be produced and assembled in a particularly simple manner. In particular, with the reflective element being formed on the mechanical fixture, the reduction of the width of the light-emitting area by the reflective element may be easily adapted to the intended application of the lighting device.

In another exemplary embodiment, the cavity is at least partially filled with a transparent filler material. The transparent filler material is in particular based on silicone to provide flexible properties for the housing while ensuring a high transparency of the emitted light. The transparent filler material may be dispensed into the cavity through the opening by injecting and curing the filler material. The transparent filler material may in particular embed the light-emitting elements for an effective protection, e.g., against mechanical impact or humidity. At the same time, the transparent filler material may provide improved heat conduction from the light-emitting elements to the periphery of the housing. The transparent filler material embedding the light emitting elements may enable a so-called encapsulation gain of light coming out of the LEDs. In other words, the filler material allows for a better matching or "smoother" transition of the refractive indices from light emitting elements to filler material to air which enables a gain in light emission.

In another exemplary embodiment, the lighting device further comprises an optical element that is arranged in the opening. The optical element may comprise diffractive and/or reflective elements. In an exemplary embodiment, the lighting device further comprises a diffusor layer (translucent layer) arranged in the opening. With a diffusor layer, the emitted light passing the opening to the light-emitting area can be scattered to obtain a softer illumination. In particular, the diffusor layer enables a particularly uniform luminance appearance. In an exemplary embodiment, the diffusor layer is arranged underneath the reflective element, i.e., the diffusor layer is arranged in between the light emitting elements and the reflective element, in particular adjacent to the reflective element. The optical element has in particular the shape of a strip, such that the optical element can be produced and applied to the lighting device cost-effectively.

In an exemplary embodiment, the housing is at least partially provided by extrusion of a profile. For example, a profile may be extruded to provide a housing comprising the reflective side walls. The profile may also comprise the reflective element. In an exemplary embodiment, the reflective side walls and the reflective element are therefore integrally formed with the extrusion. In such embodiment, the reflective side walls, the reflective element and the extrusion may comprise a white, reflective material. Alternatively or in addition, in an exemplary embodiment, an additional reflective layer is formed on the reflective side walls, the reflective element and/or the extrusion.

In an exemplary embodiment, the lighting device is used in automotive lighting, in particular as signal light (e.g. turn, position and/or stop light) for the front or rear of an automobile or as automotive interior light. With flexible properties of the lighting device, the lighting device may also be brought into different shapes to conform to the design requirements in automotive lighting.

The features and example embodiments described above may equally pertain to the different aspects. In particular, with the disclosure of features relating to a lighting device according to the first aspect, also corresponding features relating to a method for production according to the second aspect and to the use according to the third aspect are disclosed.

It is to be understood that the presentation of embodiments is merely exemplary and non-limiting.

Other features will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not drawn to scale and that they are merely intended to conceptually illustrate the structures and procedures described herein.

The invention claimed is:

1. A lighting device comprising:
a housing, the housing comprising:
reflective side walls extending in a longitudinal direction of the housing;
a cavity formed between the reflective side walls, an opening of the cavity forming a light-emitting area of the lighting device; and
light-emitting elements arranged at least partially along a longitudinal direction relative to each other in the cavity, a width of the cavity expanding from the light-emitting elements towards the opening at least in sections; and
a reflective element integral with the housing and covering at least a section of the opening, the reflective element configured to reflect a part of light emitted from the light-emitting elements towards the cavity, the reflective element configured to reduce a width of the light-emitting area compared to a width of the opening and having a reflectivity that decreases from an edge region of the opening to a central region of the opening.

2. The lighting device of claim 1, wherein the reflective element forms a slit-shaped light-emitting area on the opening.

3. The lighting device of claim 1, wherein:
the reflective element has side surfaces, and
the reflective element is configured to reflect the part of light emitted from the light-emitting elements towards the cavity by means of total internal reflection on the side surfaces.

4. The lighting device according to claim 3, wherein the side surfaces for total internal reflection taper from the opening towards the light-emitting area at least in sections.

5. The lighting device of claim 1, wherein the cavity is at least partially filled with a transparent filler material.

6. The lighting device of claim 1, wherein at least part of the housing is flexible.

7. The lighting device of claim 1, wherein the reflective element is flexible.

8. A lighting device comprising:
a housing, the housing comprising:
reflective side walls extending in a longitudinal direction of the housing;
a cavity formed between the reflective side walls, an opening of the cavity forming a light-emitting area of the lighting device; and
light-emitting elements arranged at least partially along a longitudinal direction relative to each other in the cavity, a width of the cavity expanding from the light-emitting elements towards the opening at least in sections;
a mechanical fixture; and
a reflective element covering at least a section of the opening, the reflective element configured to reflect a part of light emitted from the light-emitting elements towards the cavity, the reflective element configured to reduce a width of the light-emitting area compared to a width of the opening, the reflective element formed on the mechanical fixture separate from the housing.

9. The lighting device of claim 8, wherein the reflective element forms a slit-shaped light-emitting area on the opening.

10. The lighting device of claim 8, wherein the reflective element has a reflectivity that decreases from an edge region of the opening to a central region of the opening.

11. The lighting device of claim 8, wherein:
the reflective element has side surfaces, and
the reflective element is configured to reflect the part of light emitted from the light-emitting elements towards the cavity by means of total internal reflection on the side surfaces.

12. The lighting device according to claim 11, wherein the side surfaces for total internal reflection taper from the opening towards the light-emitting area at least in sections.

13. The lighting device of claim 8, wherein the cavity is at least partially filled with a transparent filler material.

14. The lighting device of claim 8, wherein at least part of the housing is flexible.

15. The lighting device of claim 8, wherein the reflective element is flexible.

16. A method for producing a lighting device, the method comprising:
providing a housing, the housing comprising:
reflective side walls extending in a longitudinal direction of the housing,
a cavity formed between the reflective side walls, an opening of the cavity forming a light-emitting area of the lighting device, and
light-emitting elements arranged at least partially along a longitudinal direction relative to each other in the cavity, a width of the cavity expanding from the light-emitting elements towards the opening at least in sections;
covering at least a section of the opening with a reflective element, the reflective element configured to reflect a part of light emitted from the light-emitting elements towards the cavity, the reflective element configured to reduce a width of the light-emitting area compared to a width of the opening, the reflective element being at least one of moulded or filled on the opening; and
bending the housing into a predetermined shape and inserting the housing into a mechanical fixture.

17. A method for producing a lighting device, the method comprising:
providing a housing, the housing comprising:
reflective side walls extending in a longitudinal direction of the housing,
a cavity formed between the reflective side walls, an opening of the cavity forming a light-emitting area of the lighting device, and light-emitting elements arranged at least partially along a longitudinal direction relative to each other in the cavity, a width of the cavity expanding from the light-emitting elements towards the opening at least in sections, covering at least a section of the opening with a reflective element, the reflective element configured to reflect a part of light emitted from the light-emitting elements towards the cavity, the reflective element configured to reduce a width of the light-emitting area compared to a width of the opening; and bending the housing into a predetermined shape and inserting the housing into a mechanical fixture, the reflective element formed on the mechanical fixture.

18. The method of claim 17, wherein the reflective element has a reflectivity that decreases from an edge region of the opening to a central region of the opening.

19. The method of claim 17, wherein:

the reflective element has side surfaces, the reflective element is configured to reflect the part of light emitted from the light-emitting elements towards the cavity by means of total internal reflection on the side surfaces, and the side surfaces for total internal reflection taper from the opening towards the light-emitting area at least in sections.

* * * * *